United States Patent
Bai et al.

(10) Patent No.: US 11,481,528 B2
(45) Date of Patent: Oct. 25, 2022

(54) VIRTUAL TRACK DESIGN SYSTEM FOR MOBILE DEVICES AND IMPLEMENTATION METHOD THEREOF

(71) Applicant: SHANGHAI SLAMTEC CO., LTD., Shanghai (CN)

(72) Inventors: Jing Bai, Shanghai (CN); Wenhao He, Shanghai (CN); Benniu Ji, Shanghai (CN); Junchao Lv, Shanghai (CN); Di Zhang, Shanghai (CN); Yuxiang Li, Shanghai (CN); Jueshen Huang, Shanghai (CN); Shikai Chen, Shanghai (CN)

(73) Assignee: SHANGHAI SLAMTEC CO., LTD., Shanghai (CN)

( * ) Notice: Subject to any disclaimer, the term of this patent is extended or adjusted under 35 U.S.C. 154(b) by 601 days.

(21) Appl. No.: 16/496,451

(22) PCT Filed: Mar. 23, 2018

(86) PCT No.: PCT/CN2018/080272
§ 371 (c)(1),
(2) Date: Sep. 23, 2019

(87) PCT Pub. No.: WO2018/171736
PCT Pub. Date: Sep. 27, 2018

(65) Prior Publication Data
US 2021/0110086 A1 Apr. 15, 2021

(30) Foreign Application Priority Data

Mar. 24, 2017 (CN) .......................... 201710181094.0

(51) Int. Cl.
*G06F 30/15* (2020.01)
*G05D 1/02* (2020.01)
(Continued)

(52) U.S. Cl.
CPC ........... *G06F 30/15* (2020.01); *G05D 1/0214* (2013.01); *G05D 1/0221* (2013.01); *G06F 9/4843* (2013.01); *G06N 5/02* (2013.01)

(58) Field of Classification Search
CPC ..... G06F 30/15; G06F 9/4843; G05D 1/0214; G05D 1/0221; G05D 1/0274; G06N 5/02
See application file for complete search history.

(56) References Cited

U.S. PATENT DOCUMENTS

| | | | |
|---|---|---|---|
| 6,598,169 B1 * | 7/2003 | Warwick | G06F 1/28 719/321 |
| 7,211,980 B1 * | 5/2007 | Bruemmer | G05D 1/0274 318/587 |

(Continued)

FOREIGN PATENT DOCUMENTS

| | | |
|---|---|---|
| CN | 102183959 A | 9/2011 |
| CN | 105190461 A | 12/2015 |

(Continued)

*Primary Examiner* — Richard M Camby
(74) *Attorney, Agent, or Firm* — Bayramoglu Law Offices LLC

(57) ABSTRACT

A virtual track design system for mobile devices and implementation method thereof are disclosed. The virtual track design system includes communication module: which is mainly used for relevant map information, virtual track information, positioning information, and task information transmission, and acts as a bridge; interaction module: which sets fixed track with arbitrary shape and length through graphical editing environment, and supports segmental modification, deletion of tracks and other functions. After editing, sends the virtual track information to the intelligent cruise algorithm processing module; acquisition module: which gets the virtual track information provided by the interaction module, stores relevant data, and sends the information to the key point of track extraction module. The (Continued)

invention does not require additional cost to deploy auxiliary equipment, and is more convenient, flexible and fast to use.

3 Claims, 1 Drawing Sheet

(51) Int. Cl.
*G06F 9/48* (2006.01)
*G06N 5/02* (2006.01)

(56) References Cited

U.S. PATENT DOCUMENTS

| | | | |
|---|---|---|---|
| 2008/0009964 A1* | 1/2008 | Bruemmer | G06N 3/008 |
| | | | 700/245 |
| 2009/0234499 A1* | 9/2009 | Nielsen | B25J 9/161 |
| | | | 700/250 |
| 2016/0165795 A1 | 6/2016 | Balutis et al. | |

FOREIGN PATENT DOCUMENTS

| | | |
|---|---|---|
| CN | 105259898 A | 1/2016 |
| CN | 106325271 A | 1/2017 |
| CN | 106843229 A | 6/2017 |

\* cited by examiner

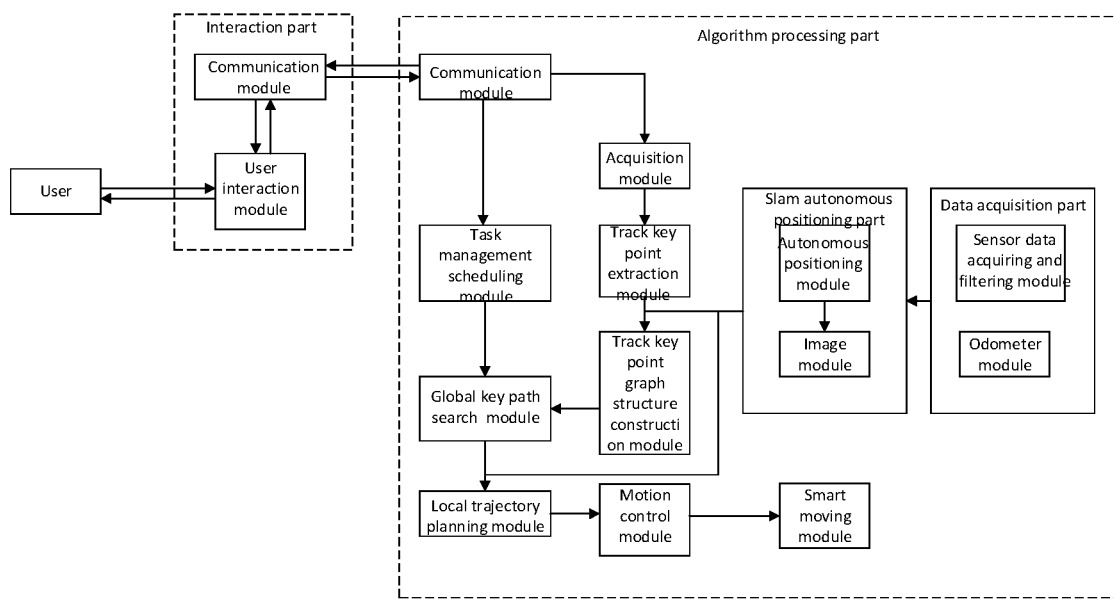

VIRTUAL TRACK DESIGN SYSTEM FOR MOBILE DEVICES AND IMPLEMENTATION METHOD THEREOF

CROSS REFERENCE TO RELATED APPLICATIONS

This application is the national phase entry of International Application No. PCT/CN2018/080272, filed on Mar. 23, 2018, which is based upon and claims priority to Chinese Patent Application No. 201710181094.0 filed on Mar. 24, 2017, the entire contents of which are incorporated herein by reference.

TECHNICAL FIELD

The present invention relates to a virtual track design system and implementation method thereof, particularly to a virtual track design system for mobile devices and implementation method thereof.

BACKGROUND

At present, the existing setpoint cruise systems based on the preset trajectory are mainly implemented as follows:

First, laying track. Magnetic conductivity physical traction systems such as urban trams and some food-delivery robots are used for laying track to realize setpoint cruise according to a preset track. This scheme uses track technology and auxiliary sensors (infrared sensor, ultrasonic sensor and other sensors) to achieve obstacle avoidance behavior. Laying tracks has the following disadvantages: 1. additional deployment of tracks is required, which results in high cost, complicated operation and inflexible usage; 2. high operating noise and greatly change the environment.

Second, the visible light camera, infrared thermal imager and other detection instruments are used to patrol the line to achieve the setpoint cruise according to the preset trajectory. This scheme also requires the deployment of auxiliary equipment in the working environment. Similarly, the operation is complex, the cost is high and the operation is inflexible. In addition, there is no guarantee of environmental invariability and cleanliness.

Based on the deficiencies of the existing cruise system at setpoint according to the preset trajectory, the present invention provides a new virtual track design and a method for realizing the navigation system.

SUMMARY

The technical problem to be solved by the present invention is to provide a virtual track design system for mobile devices and an implementation method thereof, which does not need to deploy additional auxiliary equipment and is more convenient, flexible and fast to use. In addition, there is no impact on the environment, and it is more convenient to add and remove the virtual track, and the system is more intelligent.

The invention solves the above technical problems through the following technical solutions: a virtual track design system for mobile devices, wherein its core modules and functions are as follows:

communication module: the communication module is mainly used for relevant map information, virtual track information, positioning information, and task information transmission, and acts as a bridge;

interaction module: the interaction module sets fixed track with arbitrary shape and length through graphical editing environment, and supports segmental modification, deletion of tracks and other functions. After editing, the interaction module sends the virtual track information to the intelligent cruise algorithm processing module;

acquisition module: the acquisition module gets the virtual track information provided by the interaction module, stores relevant data, and sends the virtual track information to the orbital key point extraction module;

orbital key point extraction module: the key point information of the virtual track can be extracted by the orbital key point extraction module according to the virtual track information, and a point where the derivative of the first order is 0 by piecewise fitting according to the limiting conditions such as the slope of the curve, etc., etc. is the key point of the virtual track;

sensor data acquisition and filtering module: the data of the sensor configured on the intelligent device is collected, and relevant filtering algorithm is adopted to remove the noise point of measurement data;

odometer module: the odometer obtains the mileage data of intelligent devices and provides prior knowledge for the autonomous positioning module;

map module: the map module mainly uses SLAM related algorithm to build environment map. The map can be used for global path planning and autonomous positioning module, which is the core module of intelligent mobile algorithm;

autonomous positioning module: based on the current sensor information, the autonomous positioning module constructs the storage module by combining the map, and the relevant matching algorithm is used to obtain the current position information and posture information, so that the intelligent device can know its position and posture in the environment in real time;

graph structure construction module of the orbital key point: the graph structure construction module uses the key point information in the orbital key point extraction module and map information of sensor data acquisition and filtering module, combines the accessibility between key points, constructs vertex and edge information of the graph structure, and provides data support for the search of key track of virtual track;

task scheduling management module: this module is mainly used to manage navigation tasks issued by users, including setting task sequence, task distribution, task execution logic, invoking path planning service and other parts. It is the control center of the whole system;

global key point path search module: according to tasks issued by the task scheduling management module and information of the autonomous positioning module, combining with the heuristic search algorithm, the global key point path search module searches the optimal path along the virtual track from the starting point to the end point by using graph structure of the track key point, and guides the intelligent device to complete the cruise task;

local trajectory planning module: the local trajectory planning module generates a smooth collision-free control decision by using observation data fused by multi-sensors, the current virtual track node information and autonomous positioning information, and combining with the current speed information. So that the intelligent device can complete the specified cruise task without collision.

motion control module: motion control module generates motion control decisions by using the collision free control decisions generated by the local trajectory planning module, and combining with the intelligent devices motion model, to control the smooth and collision-free movement of intelligent devices at a certain speed.

intelligent movement module: intelligent movement module receives the instruction of motion control module to control the collision-free movement of the device.

Preferably, the communication module includes a client communication module and a communication module of system algorithm processing layer.

The invention also provides an implementation method of a virtual track design system for mobile devices, including the following steps:

Step 1: setting, adding, deleting and editing the virtual track information by users through the interaction module sending the virtual track information to the algorithm processing part by the communication module.

Step 2: receiving the corresponding virtual track information sent by the interaction module by the communication module of the algorithm processes part, and going to step 3.

Step 3: after receiving the relevant information of the virtual track, extracting by the acquisition module, the key point information of virtual track based on the virtual track information, and a point where the derivative of the first order is 0 by piecewise fitting according to the limiting conditions such as the slope of the curve, etc., etc. is the key point of the virtual track, and going to step 4.

Step 4: combining with map information of map module, key points information of track, and accessibility between key points to construct vertex and edge information of graph structure.

Step 5: after receiving the navigation task by the communication module, according to the information of the autonomous positioning module and the search algorithm, searching the optimal key points path along the virtual track from the starting point to the end point by using the graph structure of the key points along the track in step 4, and going to step 6.

Step 6: according to the key point path generated in step 5, combining with the current fusion observation information and autonomous positioning information of the mobile device, and according to the motion speed and model of the mobile device, to generate the control decision. If the control decision is generated, then going to step 7, otherwise, exiting and ending the task.

Step 7: smoothening the speed according to the control decision of step 6, and issuing control instructions to the mobile device, and controlling the movement of the mobile device.

The advantages of the invention are: the invention can set fixed track with arbitrary shape and length on the interactive interface by the user through interactive mode, and supports functions such as segmenting modification and track deletion, making it convenient and flexible in operation. According to the virtual track given by the user, key points of the track (intersections, inflection points and other characteristic points representing the track characteristics) are extracted to construct the graph of the virtual track. According to the starting point of the mobile device and the end point set by the user, the key points of the virtual track closest to the starting point and the end point were searched respectively, and graph is used to search the shortest virtual track to the destination point. By using the trajectory planning strategy and combining with the sensing sensor of mobile devices, the mobile device can move to the designated position smoothly, avoiding any collision, and realize the set-point cruise function. The invention does not require additional cost to deploy auxiliary equipment, and is more convenient, flexible and fast to use. In addition, it does not need to change the environment, and it is more convenient to add and remove the vritual track and the present invention is more intelligent.

BRIEF DESCRIPTION OF THE DRAWINGS

FIG. 1 is the schematic diagram of the present invention.

DETAILED DESCRIPTION OF THE EMBODIMENTS

In order to specifically explain the technical solution of the present invention, FIGURE is used to represent the preferred embodiment of the invention as below.

As shown in FIG. 1, virtual track design system for mobile devices of the present invention includes:

communication module: which contains two parts, client communication module and system algorithm processing layer communication module. It is mainly used for relevant map information, virtual track information, positioning information, and task information transmission, and acts as a bridge;

interaction module: which sets fixed track with arbitrary shape and length through graphical editing environment, and supports segmental modification, deletion of tracks and other functions. After editing, sends the virtual track information to the intelligent cruise algorithm processing module;

acquisition module: which gets the virtual track information provided by the interaction module, stores relevant data, and sends the virtual track information to the key point of track extraction module;

orbital key point extraction module: by which according to virtual track information, the key points information of the virtual track can be extracted, and a point where the derivative of the first order is 0 by piecewise fitting according to the limiting conditions such as the slope of the curve, etc. is the key point of the virtual track;

sensor data acquisition and filtering module: by which the data of the sensor configured on the intelligent device is collected, and relevant filtering algorithm is adopted to remove the noise of measurement data;

odometer module: which obtains the mileage data of intelligent devices and provide prior knowledge for the autonomous positioning module;

map module: which mainly uses SLAM related algorithm to build environment map. The map can be used for global path planning and autonomous positioning module, which is the core module of intelligent mobile algorithm;

autonomous positioning module: which is based on the current sensor information, the storage module is constructed by combining with the map, and the relevant matching algorithm is used to obtain the current position information and posture information, so that the intelligent device can know its position and posture in the environment in real time;

graph structure construction module of the orbital key point: which uses the key point information in the orbital key point extraction module and map information of sensor data acquisition and filtering module. Combines the accessibility between key points, constructs vertex and edge information of the graph structure, and provides data support for the search of key track of virtual track;

task scheduling management module: this module is mainly used to manage navigation tasks issued by users, including setting task sequence, task distribution, task execution logic, invoking path planning service and other parts. It is the control center of the whole system;

global key point path search module: which is according to the tasks issued by the task scheduling management module and autonomously positions module information, combining with the heuristic search algorithm, searches the optimal path along the virtual track from the starting point to the end point by using the graph structure of the orbital key point of track, and guides the intelligent device to complete the cruise task;

local trajectory planning module: which uses the observation data fused by multi-sensor, current virtual track node information and autonomous positioning information, and combines with the current speed information to generate a smooth collision-free control decision so that the intelligent device can complete the specified cruise task without collision.

motion control module: which uses collision free control decisions generated by the local trajectory planning module, combines with the intelligent device's motion model, generates motion control decisions, to control the smooth and collision-free movement of intelligent devices at a certain speed.

intelligent movement module: which receives the instruction of motion control module to control the collision-free movement of the device.

Communication module and interaction module constitute the interaction part.

The acquisition module, the orbital key point extraction module, the sensor data acquisition and filtering module, the odometer module, the map module, the graph structure construction module of orbital key point, the task scheduling management module, the global key point path search module, the local trajectory planning module, the autonomous positioning module, the motion control module, and the intelligent movement module constitute the algorithm processing part.

An implementation method of a virtual track design system for mobile devices provided by the invention includes:

Step 1: setting, adding, deleting and editing the virtual track information by users through the interaction module sending the virtual track information to the algorithm processing part by the communication module.

Step 2: receiving the corresponding virtual track information sent by the interaction module by the communication module of the algorithm processes part, and going to step 3.

Step 3: after receiving the relevant information of the virtual track, extracting by the acquisition module, the key information of virtual track based on the virtual track information, and a point where the derivative of the first order is 0 by piecewise fitting according to limiting conditions such as slope of the curve, etc. is the key point of the virtual track, and going to step 4.

Step 4: combining with map information of map module, key points information of track, and accessibility between key points to construct vertex and edge information of graph structure.

Step 5: after receiving the navigation task by the communication module, according to the information of the autonomous positioning module and the search algorithm, searching the optimal key points path along the virtual track from the starting point to the end point by using the graph structure of the key points along the track in step 4, and going to step 6.

Step 6: according to the key point path generated in step 5, combining with the current fusion observation information and autonomous positioning information of the mobile device, and according to the motion speed and model of the mobile device, to generate the control decision. If the control decision is generated, then going to step 7, otherwise, exiting and ending the task.

Step 7: smoothening the speed according to the control decision of step 6, and issuing control instructions to the mobile device, and controlling the movement of the mobile device.

The detailed embodiment above further specifically explains the technical problems, the technical solution and beneficial effects of the present invention. It should be understood that the above is only a specific embodiment of the present invention, which should not be used to limit the invention. Any modification, equivalent replacement and improvement made within the spirit and principles of the invention shall be included in the protection scope of the invention.

What is claimed is:

1. A virtual track design system for mobile devices, comprising a core module, wherein the core module comprises a communication module, an interaction module, an acquisition module, an orbital key point extraction module, a sensor data acquisition and filtering module, an odometer module, a map module, an autonomous positioning module, a graph structure construction module of orbital key point, a task scheduling management module, a global key point path search module, a local trajectory planning module, a motion control module and an intelligent movement module; and wherein the communication module is mainly configured for relevant map information, virtual track information, positioning information, and task information transmission, and acts as a bridge;

the interaction module sets fixed track with arbitrary shape and length through graphical editing environment, and supports segmental modification and deletion of tracks; after editing the virtual track information, the interaction module sends the virtual track information to an intelligent cruise algorithm processing module;

the acquisition module gets the virtual track information provided by the interaction module, stores relevant data, and sends the virtual track information to the orbital key point extraction module;

key point information of the virtual track is extracted by the orbital key point extraction module, and a point where a derivative of the first order is 0 by piecewise fitting according to limiting conditions of a slope of a curve is a key point of the virtual track;

data of the sensor configured on a mobile device is collected by the sensor data acquisition and filtering module, and relevant filtering algorithm is adopted to remove noise of measurement data;

the odometer module obtains mileage data of the mobile device and provides a predetermined data for the autonomous positioning module;

the map module mainly uses SLAM related algorithm to build an environment map; the environment map is configured for the global path planning and autonomous positioning module, and the map module is a core module of an intelligent mobile algorithm;

based on current sensor information, the autonomous positioning module constructs a storage module by combining the environment map, and relevant matching algorithm is configured to obtain the current position information and current posture information, so that the mobile device knows position and posture of the mobile device in environment in real time;

the graph structure construction module of orbital key point uses the key point information in the orbital key point extraction module and map information of sensor data acquisition and filtering module; combines the accessibility between key points, constructs vertex and edge information of a graph structure, and provides data support for a search of key track of the virtual track;

the task scheduling management module is mainly configured to manage navigation tasks issued by users, including setting task sequence, task distribution, task execution logic and invoking path planning service, and is a control center of the virtual track design system;

according to the navigation tasks issued by the scheduling management module and information of the autonomously positions module, combining with a heuristic search algorithm, the global key point path search module searches an optimal path along the virtual track from a starting point to an end point by using a track graph structure of the orbital key point, and guides the mobile device to complete the navigation tasks;

the local trajectory planning module generates a smooth collision-free control decision by using observation data fused by multi-sensor, current virtual track node information and autonomous positioning information, and combining with current speed information; so that the mobile device completes a specified navigation task without collision;

the motion control module generates motion control decisions by using the collision free control decision generated by the local trajectory planning module, combining with the mobile device motion model to control a smooth and collision-free movement of the mobile device at a predetermined speed; and wherein the intelligent movement module receives instruction of the motion control module to control the smooth and collision-free movement of the mobile device.

2. The virtual track design system for mobile devices of claim 1, wherein the communication module comprises a client communication module and a communication module of a system algorithm processing layer.

3. An implementation method fora virtual track design system for mobile devices, comprising the following steps:
   step 1: setting, adding, deleting and editing virtual track information by users through interaction module sending the virtual track information to an algorithm processing part by a communication module;
   step 2: receiving, by the communication module of the algorithm processes part, the virtual track information sent by an interaction module, and going to step 3;
   step 3: after receiving the virtual track information, extracting by the acquisition module, key point information of virtual track based on the virtual track information, and a point where a derivative of the first order is 0 by piecewise fitting according to limiting condition a slope of a curve is a key point of the virtual track, and going to step 4;
   step 4: combining with map information of map module, key points information of track, and accessibility between key points to construct vertex and edge information of graph structure;
   step 5: after receiving navigation task by the communication module, according to information of the autonomous positioning module and search algorithm, searching an optimal key points path along the virtual track from a starting point to an end point by using the graph structure of the key points along the track in step 4, and going to step 6;
   step 6: according to the optimal key point path generated in step 5, combining with current fusion observation information and autonomous positioning information of a mobile device, and according to a motion speed and model of the mobile device, to generate a control decision; if the control decision is generated, then going to step 7, otherwise, exiting and ending the navigation task; and
   step 7: smoothening the motion speed according to the control decision of step 6, and issuing control instructions to the mobile device, and controlling a movement of the mobile device.

* * * * *